United States Patent [19]

Iwasaki et al.

[11] Patent Number: 5,240,505
[45] Date of Patent: Aug. 31, 1993

[54] METHOD OF AN APPARATUS FOR FORMING THIN FILM FOR SEMICONDUCTOR DEVICE

[75] Inventors: Masanobu Iwasaki; Hiromi Itoh, both of Hyogo, Japan

[73] Assignee: Mitsubishi Denki Kabushiki Kaisha, Tokyo, Japan

[21] Appl. No.: 561,631

[22] Filed: Aug. 2, 1990

[30] Foreign Application Priority Data

Aug. 3, 1989 [JP] Japan ................................. 1-202062
Aug. 2, 1990 [JP] Japan ................................. 2-206158

[51] Int. Cl.⁵ ............................................... C23C 16/00
[52] U.S. Cl. ........................................ 118/719; 118/715; 118/724; 118/725
[58] Field of Search ............... 118/715, 725, 719, 725, 118/723, 724

[56] References Cited

U.S. PATENT DOCUMENTS

| | | | |
|---|---|---|---|
| 3,969,779 | 10/1972 | Murai | 118/730 |
| 4,505,949 | 3/1985 | Jelks | 427/53.1 |
| 4,592,306 | 6/1986 | Gallego | 118/733 |
| 4,615,298 | 10/1986 | Yamazaki | 118/719 |
| 4,825,808 | 5/1989 | Takahashi | 118/719 |
| 4,969,415 | 11/1990 | Bartha | 118/723 |
| 4,976,996 | 12/1990 | Mankowski | 118/725 |

FOREIGN PATENT DOCUMENTS 57-48226 3/1982 Japan.
63-250463 10/1988 Japan.

OTHER PUBLICATIONS

"A Mechanism for Selectivity Loss During Tungsten CVD" by J. R. Creighton, "J. Electrochemical Society", vol. 136, No. 1, pp. 271-275, Jan. 1989.

Primary Examiner—Richard Bueker
Attorney, Agent, or Firm—Lowe, Price, LeBlanc & Becker

[57] ABSTRACT

A method of forming a thin film for a semiconductor device, for forming a metal thin film by chemical vapor deposition on an intermediate layer which is provided on a substrate, comprises the steps of activating the surface of the intermediate layer by introducing a halide gas of a metal for forming the thin film onto the surface of the intermediate layer, forming nuclei on the surface of the intermediate layer by introducing a silane-system gas onto the activated surface of the intermediate layer, and introducing the halide gas and a reducing gas onto the surface of the intermediate layer formed with the nuclei, thereby depositing the metal thin film on the surface of the intermediate layer.

16 Claims, 10 Drawing Sheets

METHOD OF AN APPARATUS FOR FORMING THIN FILM FOR SEMICONDUCTOR DEVICE

BACKGROUND OF THE INVENTION

1. Field of the Invention

The present invention relates to a method of and an apparatus for forming a thin film for a semiconductor device, and more specifically, it relates to a method of and an apparatus for forming a thin film by chemical vapor deposition (hereinafter referred to as CVD) on a substrate, such as a semiconductor substrate or an insulating film provided on a semiconductor substrate, of a semiconductor device through an intermediate layer.

2. Description of the Background Art

In general, a wiring pattern for a semiconductor device is mainly formed of aluminum. In such a pattern of aluminum, however, projections called "hillocks" are grown in heat treatment after patterning, to cause electrical shorting across wires and break interlayer isolation films. Further, the temperature for heat treatment performed after formation of the wiring pattern must be limited to about 450° C. since aluminum has a low melting point of about 600° C. Thus, a problem is caused in manufacturing.

In recent years, therefore, metals having high melting points or silicides of such metals have been watched as wiring materials in substitution for aluminum. Among such materials, tungsten (W) has been positively subjected to development as a material having a high melting point of 3370° C. and low specific resistance (bulk) of 5.6 t ; cm. To this end, an attempt has been made to form a thin film of tungsten by CVD, which is excellent in step coverage.

A thin film of tungsten may be formed through CVD by a process of reducing tungsten hexafluoride ($WF_6$) with hydrogen ($H_2$) or a process of reducing $WF_6$ with silane ($SiH_4$). Reaction formulas of such reduction processes are as follows:

  (1)

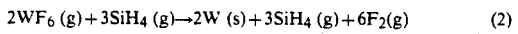  (2)

where (g) and (s) represent gaseous and solid phases respectively. The process of reducing $WF_6$ with $H_2$ is superior in step coverage to the process of reducing $WF_6$ with $SiH_4$. However, $H_2$ is inferior to $SiH_4$ in ability for reducing $WF_6$, and hence the $H_2$ reduction process is inferior in deposition rate and nucleation power to the $SiH_4$ reduction process. Therefore, it is necessary to increase the deposition temperature in the $H_2$ reduction process. If the deposition temperature is increased, however, crystal grain size is excessively enlarged. Further, difficulty of nucleation causes deterioration of surface morphology and inferior homogeneity of film thickness within the surface plane. Therefore, it is usually difficult to manufacture W-CVD according to the process of reducing $WF_6$ with $H_2$. Further, W-CVD has difficulty in adhesive properties.

A thin film of tungsten formed by CVD is inferior in adhesion to an insulating film. In general, therefore, an intermediate layer is provided on a substrate or an insulating film, so that the tungsten thin film is formed on the intermediate layer. This intermediate layer is adapted to facilitate adherence of the tungsten thin film. Such an intermediate layer is prepared from an Si material such as polysilicon (poly-Si), a silicide material of a metal having a high melting point such as tungsten silicide ($WSi_x$), a nitride of a metal having a high melting point such as titanium nitride (TiN), or the like.

When polysilicon is employed, however, it is necessary to dope an impurity corresponding to a junction layer of each contact, so that the steps are complicated. Further, the deposited tungsten thin film is inferior in surface morphology.

Also when tungsten silicide is employed, the tungsten thin film is inferior in surface morphology.

As compared with the above cases of polysilicon and tungsten silicide, a tungsten thin film deposited on an intermediate layer of titanium nitride has the advantage of being superior in surface morphology and excellent in adhesion. Further, titanium nitride has excellent properties as an underlayer for a CVD-W film since the same serves as a barrier metal which can be in contact with both of P-type and N-type layers.

However, it has been very difficult to form a tungsten film on such an intermediate layer of TiN by the conventional CVD process through $H_2$ reduction, due to problems of the deposition rate, homogeneity of film thickness, surface morphology and the like, in particular.

Japanese Patent Laying-Open Gazette No. 63-250463 discloses a method of introducing a mixed gas of $WF_6$ and an inert gas, or a mixed gas of $WF_6$ gas and $H_2$ gas, for depositing a tungsten thin film to a prescribed thickness and thereafter introducing a gas containing $WF_6$ gas and a silane-system reducing gas for reducing the $WF_6$ gas with the silane-system reducing gas, thereby growing a metal thin film. The tungsten thin film initially formed by introduction of the mixed gas of $WF_6$ gas and the inert gas or the mixed gas of $WF_6$ gas and $H_2$ gas has an excellent contact property with both of N-type and P-type diffusion layers. Further, the tungsten film grown by the $WF_6$ gas and the silane-system reducing gas in the second step is deposited at a high rate and hence the same can be increased in thickness. According to the method disclosed in the above gazette, therefore, it is possible to implement a tungsten wiring film which has an excellent contact property with both of N-type and P-type diffusion layers with no leakage current.

However, even if a tungsten film is formed on an intermediate layer of TiN by the method disclosed in the aforementioned gazette, excellent step coverage cannot be attained dissimilarly to the $H_2$ reduction process, since the $WF_6$ gas is reduced with the silane-system reducing gas.

SUMMARY OF THE INVENTION

An object of the present invention is to provide a method of and an apparatus for forming a thin film, which can form a thin film having excellent surface morphology at a high deposition rate in a homogeneous thickness on an intermediate layer of a material, such as TiN, having difficulty in depositing a tungsten film through an $H_2$ reduction process.

Another object of the present invention is to provide a method of and an apparatus for forming a thin film, which can form a metal thin film whose surface is smoothed with small surface roughness.

Still another object of the present invention is to provide a thin film forming method which can reduce dusting thin film forming steps.

The present invention provides a method of forming a metal thin film on an intermediate layer, which is provided on a substrate, by chemical vapor deposition. The inventive method comprises the steps of activating the surface of the intermediate layer by introducing a halide gas of a metal for forming the thin film onto the surface of the intermediate layer, forming nuclei on the surface of the intermediate layer by introducing a silane-system gas onto the activated surface of the intermediate layer, and introducing the halide gas and a reducing gas onto the surface of the intermediate layer on which the nuclei are formed, thereby depositing a metal thin film on the surface of the intermediate layer.

In a preferred embodiment of the present invention, the metal thin film is a tungsten thin film, the halide gas is $WF_6$ gas, and the silane-system gas is $SiH_4$ gas.

In the preferred embodiment, the intermediate layer is formed of TiN, for example.

Preferably the reducing gas employed in the metal thin film depositing step is prepared from $H_2$ gas.

According to the present invention, the substrate on which the metal thin film is formed through the intermediate layer is a semiconductor substrate or an insulating film which is formed above a semiconductor substrate.

According to the present invention, the silane-system gas is introduced onto the activated surface of the intermediate layer, thereby forming nuclei on the surface of the intermediate layer. These nuclei facilitate formation of nuclei of a metal in an initial stage of forming a metal thin film through a reduction process in accordance with CVD. According to the inventive method, therefore, it is possible to obtain a metal thin film which has a high deposition rate, good homogeneity of film thickness and excellent surface morphology.

The present invention is particularly useful for forming a tungsten thin film. However, the present invention is not restricted to the tungsten thin film but is also applicable to films of metals shown in Table 1, in addition to tungsten.

TABLE 1

| Thin Film | Soruce Gas | |
|---|---|---|
| W | $W(CO)_6$ | |
|   | $WCl_6$ | $H_2$, $SiH_4$ |
|   | $WF_6$ | |
| Mo | $Mo(CO)_6$ | |
|   | $MoCl_5$ | $H_2$, $SiH_4$ |
|   | $MoF_6$ | |
| $WSi_2$ | $WF_6$ | $SiH_4$ |
|   |   | $H_2$ |
|   | $WCl_6$ | $SiH_2Cl_2$ |
| $MoSi_2$ | $MoF_6$ | $Si_4$, $H_2$ |
|   | $MoCl_5$ | |
| $TaSi_2$ | $TaCl_5$ | $SiH_4$, $H_2$ |
|   |   | $SiH_2Cl_2$ |
| $TiSi_2$ | $TiCl_4$ | $SiH_4$, $H_2$ |

According to the present invention, the material for the intermediate layer is not restricted to TiN. Alternatively, the intermediate layer may be prepared from TiW, a metal having a high melting point or a silicide thereof, a nitride having a high melting point, or the like. The advantage of the present invention is further prompted particularly with respect to an intermediate layer which shows no surface catalytic action in deposition of the metal thin film.

The silane-system gas employed for the nucleation process may be prepared from disilane ($Si_2H_6$) or the like, in substitution for the $SiH_4$ gas.

In a first preferred aspect of the present invention, the halide gas of the metal for forming the thin film is introduced in a state of arranging a metal face of the same metal as that of the thin film close to the surface of the intermediate layer. In this aspect, the metal face is thus arranged close to the surface of the intermediate layer in order to activate the intermediate layer in the above-described first step and make disproportionate reaction between the metal face and the halide gas participate in nuclei formation. In formation of a tungsten thin film using $WF_6$, for example, the following disproportionate reaction takes place:

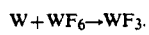

The gas $WF_3$ generated by the aforementioned disproportionate reaction is diffused on the surface of the intermediate layer, and adsorbed onto the TiN layer, which is the intermediate layer. In addition to the aforementioned $WF_3$ gas, a gas composed of $WF_x$ ($1 \leq x \leq 5$, x: integer) may also be generated by the disproportionate reaction, and similarly adsorbed onto the TiN layer.

It is conceivable that the $WF_6$ gas also directly reacts with the TiN layer, which is the intermediate layer, to generate materials, such as TiW, WN, $TiF_x$ and the like, for example, serving as precursors for the nuclei, on the TiN layer.

The silane-system gas introduced in the second step reacts with $WF_x$ adsorbed onto the TiN layer in the aforementioned manner and TiW etc., which are reaction products of TiN and $WF_6$, to precipitate Si-system nuclei such as those of $WSi_y$. In the subsequent step, reaction between $WF_6$ and $H_2$ is facilitated by a surface catalytic action of the nuclei thus precipitated, thereby prompting deposition of the tungsten thin film.

According to the present invention, the nuclei showing a surface catalytic action for deposition of the tungsten thin film are intentionally formed on the intermediate layer in advance of the deposition reaction, whereby the deposition rate is increased and the thin film can be deposited in a homogeneous film thickness. Further, it is possible to obtain the tungsten thin film having excellent surface morphology. According to the aspect of arranging the metal face above the surface of the intermediate layer, in particular, it is possible to homogeneously adsorb $WF_x$ generated by disproportionate reaction onto the intermediate layer, thereby homogeneously precipitating the nuclei on the intermediate layer.

An apparatus according to this aspect comprises a metal face member which is arranged above the surface of an intermediate layer to be opposite to the surface of the intermediate layer, and a face member support for supporting the metal face member.

The face member support is preferably provided with a heater for controlling the temperature of the metal face member. It is possible to control disproportionate reaction between an introduced halide gas and the metal forming the metal face member by controlling the temperature of the metal face member with the heater.

The face member support is preferably movably provided, in order to adjust the distance between the surface of the intermediate layer and the metal face member. According to this embodiment, it becomes possible to control the diffusion of nuclear precursor produced as the result of the disproportionate reaction to the substrate.

The metal face member may be formed by a substrate which is coated with a metal film, or a bulk metal plate. Further, the metal face member, which is not limited to round-shape, is preferably optimized in both of size and shape to control the diffusion of nuclear precursor to the substrate.

An apparatus according to a second aspect of the present invention comprises a pretreatment chamber for performing pretreatment on the surface of an intermediate layer, and a deposition chamber, which is independent of the pretreatment chamber, for depositing a metal thin film on the surface of the pretreated intermediate layer. According to the second aspect of the present invention, the inner surface of the deposition chamber is formed of a material which shows no surface catalytic action with respect to reaction for depositing the metal thin film.

When the metal thin film is made of tungsten, such a material is prepared from quartz, SiC, or ceramics, for example.

If the metal thin film is formed of tungsten, pretreatment includes activation with $WF_6$ gas and nucleation with $SiH_4$ gas, for example. In this case, the pretreatment chamber may be independently provided with a pretreatment chamber for the activation step and another pretreatment chamber for the nucleation step.

According to the apparatus of the second aspect, the inner surface of the deposition chamber is formed of the material showing no surface catalytic action with respect to reaction for depositing the metal thin film, whereby no metal thin film is deposited on the inner surface of the deposition chamber except on the substrate transported from the pretreatment chamber, on which the nuclei have been already formed. Thus, the deposition chamber is prevented from dusting, and hence the interior of the deposition chamber is regularly maintained clean, thereby improving the yield and the like.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
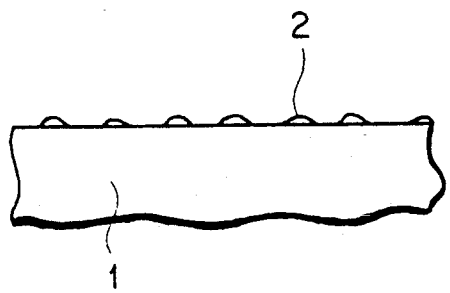
FIG. 1A is a sectional view showing a state of an intermediate layer on which nuclei are formed according to the inventive method.

FIG. 1A is a sectional view showing a state of an intermediate layer on which nuclei are formed according to the inventive method. Referring to FIG. 1A, Si-system nuclei 2 are formed on a TiN layer 1. The Si-system nuclei 2 are formed in the following manner: First, $WF_6$ gas is introduced onto the TiN layer 1. This $WF_6$ gas reacts with the surface of the TiN layer 1, and activates the surface of the TiN layer 1. Then, a silane-system gas is introduced onto the TiN layer 1, so that reactants on the surface of the TiN layer 1 react with the silane-system gas, thereby forming the Si-system nuclei 2.

Figure 1B:
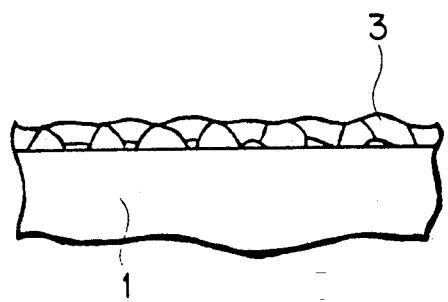
FIG. 1B is a sectional view showing an initial state of a metal thin film deposited on the intermediate layer on which nuclei are formed according to the inventive method.

FIG. 1B is a sectional view showing an initial state of a metal thin film deposited on the intermediate layer on which the nuclei are formed according to the inventive method. Referring to FIG. 1B, a tungsten thin film 3 is deposited on the TiN layer 1 in a homogeneous thickness. According to the present invention, a large number of Si-system nuclei 2 are formed on the TiN layer 1 in high concentration, whereby the tungsten thin film 3 can be formed in a homogeneous thickness.

Figure 1C:
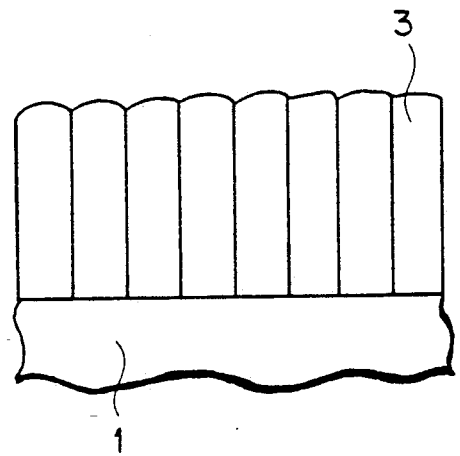
FIG. 1C is a sectional view showing a state of the metal thin film deposited on the intermediate layer on which nuclei are formed according to the inventive method.

FIG. 1C is a sectional view showing a state of the metal thin film deposited on the intermediate layer on which nuclei are formed according to the inventive method. Referring to FIG. 1C, the tungsten thin film 3 is deposited on the TiN layer 1 in a homogeneous thickness. Thus, the surface of the tungsten thin film 3 is smoothed.

As described above, the tungsten thin film 3 can be formed on the TiN layer 1 in a homogeneous thickness with a smooth surface. Further, the deposition rate can be increased since a large number of nuclei 2 have been formed on the TiN layer 1 before deposition of the tungsten thin film 3.

Figure 2A:
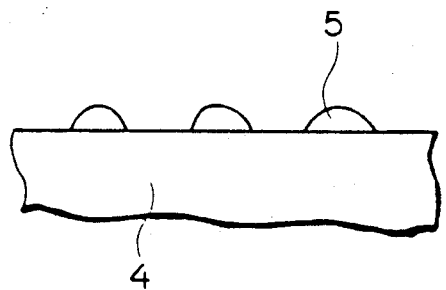
FIG. 2A is a sectional view showing an initial state of a metal thin film formed on an intermediate layer according to a conventional method with no pretreatment.

FIG. 2A is a sectional view showing an initial state of a metal thin film which is formed on an intermediate layer by a conventional method with no pretreatment. Referring to FIG. 2A, tungsten nuclei 5 are formed on a TiN layer 4. According to the conventional method, no nuclei have been formed on the TiN layer 4 to show a surface catalytic action for reaction for depositing a tungsten film, and hence nuclei are heterogeneously precipitated by direct reaction between $WF_6$ and $H_2$ in the initial stage of deposition reaction in the form of the sparse tungsten nuclei 5 shown in FIG. 2A. The precipitated tungsten nuclei 5 serve the subsequent reaction between $WF_6$ and $H_2$ as nuclei showing a surface catalytic action, and a tungsten thin film is deposited thereon.

Figure 2B:
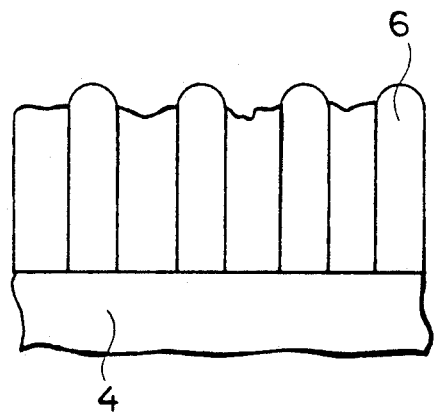
FIG. 2B is a sectional view showing a state of the metal thin film deposited on the intermediate layer according to the conventional method with no pretreatment.

FIG. 2B is a sectional view showing a state of a metal thin film which is deposited on the intermediate layer according to the conventional method with no pretreatment. Referring to FIG. 2B, a tungsten thin film 6 having a heterogeneous thickness is deposited on the TiN layer 4. Since the tungsten nuclei 5 serving as nuclei for precipitation of the tungsten thin film 6 have been heterogeneously and sparsely formed on the TiN layer 4 as shown in FIG. 2A, the tungsten thin film 6 has a heterogeneous thickness. Consequently, the tungsten thin film 6 has a rough surface.

Figure 3:
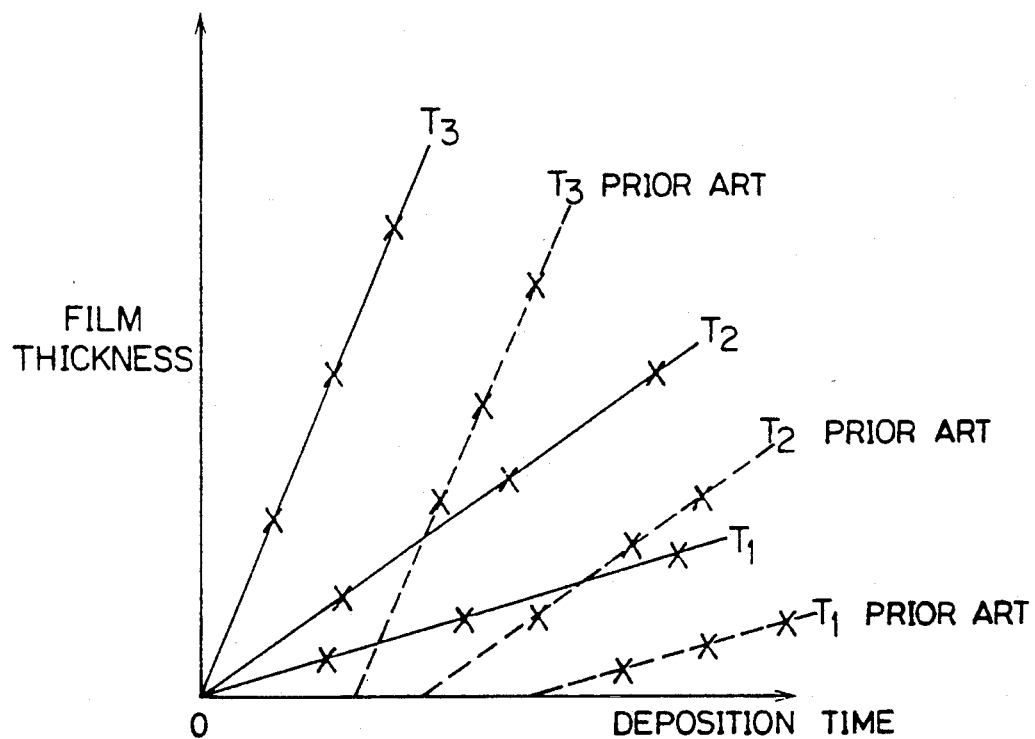
FIG. 3 illustrates relations between film thicknesses and deposition times of metal thin films deposited according to the present invention and a conventional method.

FIG. 3 illustrates relations between thicknesses and deposition times of metal thin films deposited according to the present invention and the conventional method. Referring to FIG. 3, solid lines represent those according to the inventive method and broken lines represent those according to the conventional method. Symbols $T_3$, $T_2$ and $T_1$ respectively represent the deposition temperatures, which are in relations of $T_3 > T_2 > T_1$. The deposition temperatures are within a range of 400° to 600° C. Referring to FIG. 3, there is a lag time, i.e., an induction period between starting of introduction of $WF_6$ gas and $H_2$ gas and starting of actual deposition of a tungsten thin film in each sample according to the conventional method. It means that a time is required for tungsten nuclei, which are produced as the result of the direct reaction between $WF_6$ and $H_2$ and can serve as catalysts, to be grown into prescribed concentration and dimensions for showing a catalytic action since the surface of the TiN layer is inactive as a catalyst. According to the inventive method, on the other hand, there is no such induction period. Deposition of the tungsten thin film is immediately started upon starting of introduction of $WF_6$ gas and $H_2$ gas. This is because Si-system nuclei have already been formed on the surface of the TiN layer in active states for serving as catalysts.

Figure 4:
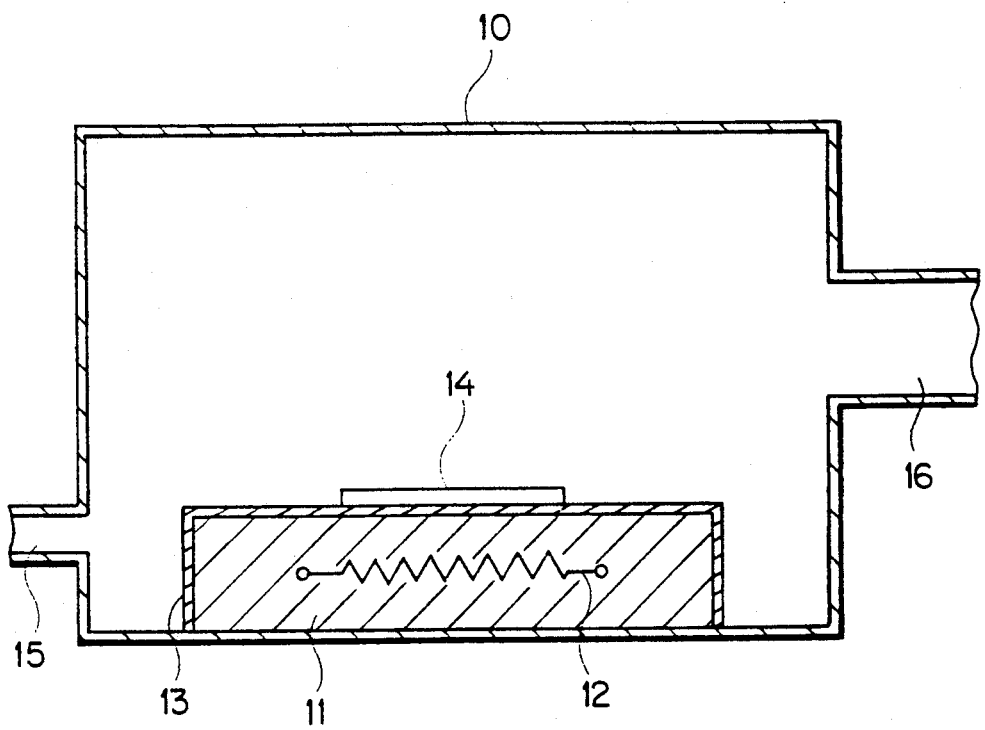
FIG. 4 is a schematic block diagram showing an apparatus employed in an embodiment of the present invention.

FIG. 4 is a schematic block diagram showing an apparatus employed in an embodiment of the present invention. Referring to FIG. 4, a substrate support 11 is provided in a reaction vessel 10. A substrate 14 is placed on the substrate support 11. This substrate 14 has a TiN layer on its surface as an intermediate layer. A tungsten film 13 is formed on the surface of the substrate support 11. This tungsten film 13 has been formed as the result of deposition of a tungsten film on another substrate in a preceding operation. When the substrate support 11 is newly employed, therefore, no tungsten film is present on its surface. However, the inventors have found that the tungsten film 13 is preferably formed on the surface of the substrate support 11, in order to effectively facilitate deposition of tungsten films. This means that the disproportionate reaction participates in the process of forming nuclei. Therefore, the inventors previously form the tungsten film 13 on the surface of the substrate support 11 before placing the substrate 14 thereon when the substrate support 11 is newly employed. Thus, the substrate 14 is placed on the substrate support 11 which is provided thereon with the tungsten film 13.

A heater 12 is provided in the substrate support 11 for heating the substrate 14. An inlet port 15 is provided on one side of the reaction vessel 10, in order to introduce source gases. An exhaust port 16 is provided on another side of the reaction vessel 10. In activation treatment (hereinafter referred to as "first step treatment") with introduction of $WF_6$ gas, the $WF_6$ gas is introduced into the reaction vessel 10 from the inlet port 15 with an inert gas serving as a carrier gas. After the surface of the TiN layer provided on the substrate 14 is activated, the gases are exhausted from the exhaust port 16. In nucleation treatment (hereinafter referred to as "second step treatment") with $SiH_4$ gas, the $SiH_4$ gas is introduced into the reaction vessel 10 with an inert gas serving as a carrier gas, to form nuclei on the surface of the TiN layer which is provided on the substrate 14. Thereafter the gases are exhausted from the exhaust port 16.

Then, $WF_6$ gas and $H_2$ gas are introduced into the reaction vessel 10 from the inlet port 15, to deposit a tungsten thin film on the TiN layer provided on the substrate 14. After the deposition, the gases are exhausted from the reaction vessel 10 through the exhaust port 16.

The apparatus shown in FIG. 4 was experimentally used to deposit a tungsten thin film. $WF_6$ gas and Ar gas, serving as a carrier gas, were introduced at gas flow rates of 300 SCCM and 500 SCCM respectively for 120 seconds under conditions of 450° C. and 0.2 Torr, to carry out the first step treatment for activating the surface of a TiN layer.

Then, introduction of the $WF_6$ gas was stopped and the reaction vessel 10 was evacuated through the exhaust port 16, to eliminate the $WF_6$ gas. Thereafter $SiH_4$ gas and Ar gas were introduced into the reaction vessel 10 at gas flow rates of 100 SCCM and 500 SCCM respectively for 120 seconds, to carry out the second step treatment of forming silicon nuclei on the activated surface of the TiN layer.

Then, introduction of the $SiH_4$ gas was stopped and the chamber was maintained at 0.8 Torr and 450° C., to introduce Ar gas at a gas flow rate of 100 SCCM while introducing $WF_6$ gas and $H_2$ gas at gas flow rates of 300 SCCM for 300 seconds. A tungsten thin film of about 4000 Å in thickness was formed on the TiN layer by the $H_2$ reduction process.

Table 2 shows the aforementioned thin film forming conditions.

TABLE 2

| | Condition | | | | | | Film |
|---|---|---|---|---|---|---|---|
| | Gas Flow Rate (SCCM) | | | | Pressure | Temperature | Time | Thickness |
| | $WF_6$ | $SiH_4$ | $H_2$ | Ar | (Torr) | (°C.) | (sec) | (Å) |
| 1st Step Treatment | 300 | — | — | 500 | 0.2 | 450 | 120 | — |
| 2nd Step Treatment | — | 100 | — | 500 | | | 120 | — |
| $H_2$ Reduction | 300 | — | 3000 | 100 | 0.8 | | 300 | 4000 |

TABLE 2-continued

| | Condition | | | | | | Film |
|---|---|---|---|---|---|---|---|
| | Gas Flow Rate (SCCM) | | | | Pressure | Temperature | Time | Thickness |
| | $WF_6$ | $SiH_4$ | $H_2$ | Ar | (Torr) | (°C.) | (sec) | (Å) |
| W Deposition | | | | | | | | |

The thickness of the as-formed tungsten thin film was measured by SEM observation. The measurement was made in the vicinity of a center of a 6-inch substrate.

Figure 5:
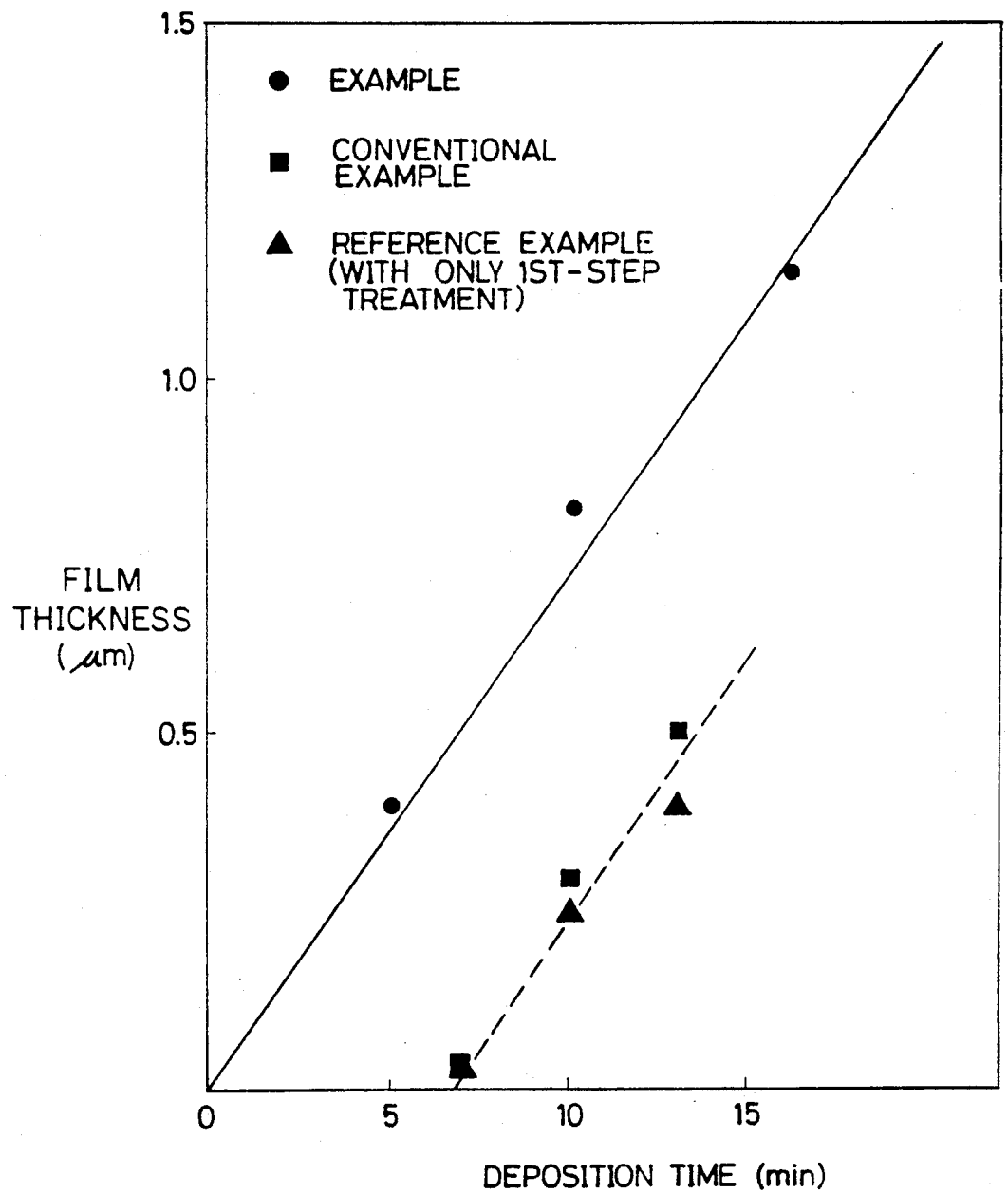
FIG. 5 illustrates relations between film thicknesses and deposition times of metal thin films according to the embodiment of the present invention and conventional and comparative methods.

FIG. 5 shows relations between film thicknesses and deposition times of tungsten thin films deposited on TiN layers. Each TiN layer was deposited on a thermal oxidation film ($SiO_2$) of 5000 Å in thickness formed on an Si substrate, or a P-type Si substrate using reactive sputtering, and then subjected to heat treatment in a nitrogen atmosphere of 800° C. for 30 seconds.

FIG. 5 also shows the results of conventional samples whose tungsten thin films were formed by directly supplying $WF_6$ gas and $H_2$ gas without carrying out the first step treatment and the second step treatment, and comparative samples whose tungsten thin films were deposited after carrying out the first step treatment alone. Pretreatment and thin film forming conditions were as shown in Table 2.

Referring to FIG. 5, symbols ●, ■ and ▲ represent the inventive samples, the conventional samples and the comparative samples respectively. As shown in FIG. 5, each of the conventional and comparative samples exhibited an induction period of about seven minutes, which caused no deposition of a tungsten film upon introduction of $WF_6$ gas and $H_2$ gas. This may be regarded as a time required for forming nuclei enabling deposition of a thin film. Thus, it is easily supposed from this example that TiN is a material which has difficulty in forming tungsten nuclei. According to the inventive sample, on the other hand, deposition of a tungsten film was started immediately upon introduction of $WF_6$ gas and $H_2$ gas substantially with no induction period. Consequently, it is possible to form a tungsten film having a thickness of 400 Å under the conditions shown in Table 2 in about five minutes according to the present invention, while it requires about 12 minutes according to the conventional method.

Figure 6:
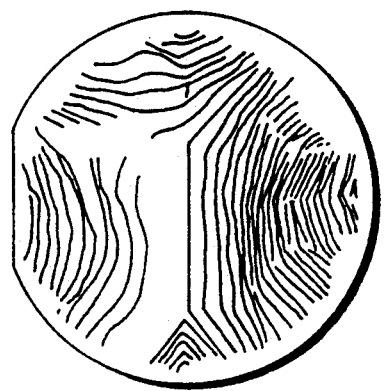
FIG. 6 is a plan view showing a sheet resistivity map of a metal thin film according to the embodiment of the present invention.
Figure 7:
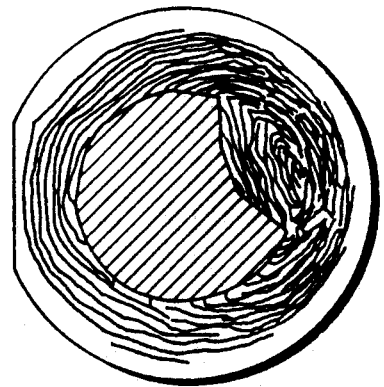
FIG. 7 is a plan view showing a sheet resistivity map of a metal thin film obtained according to a conventional method.
Figure 8:
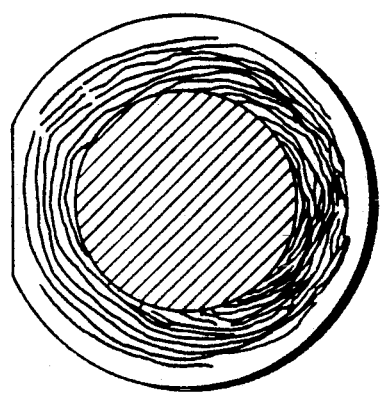
FIG. 8 is a plan view showing a sheet resistivity map of a comparative metal thin film subjected to first step treatment alone.
Figure 9:
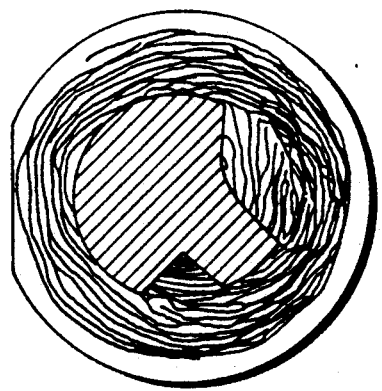
FIG. 9 is a plan view showing a sheet resistivity map of a comparative metal thin film subjected to second step treatment alone.

Sheet resistivity values were measured after lapses of five minutes for depositing tungsten thin films. FIG. 6 is a plan view showing a sheet resistivity map of a thin film obtained according to the present invention. FIG. 7 is a plan view showing a sheet resistivity map of a metal thin film according to a conventional sample, which was formed without carrying the first step treatment and the second step treatment. FIG. 8 illustrates a sheet resistivity map of a thin film, which was subjected to the first step treatment alone. FIG. 9 is a plan view showing a sheet resistivity map of a thin film according to a comparative sample, which was subjected to the second step treatment alone.

Referring to FIGS. 6 to 9, the lines represent contour lines of the resistivity values. Referring to FIGS. 7 to 9, hatched central parts represent portions substantially provided with no tungsten thin films.

As shown in FIG. 6, the tungsten thin film formed according to the present invention is homogeneous in thickness through the whole surface of the substrate of 6 inches. In the comparative and conventional samples, on the other hand, no films were deposited on the central portions although tungsten thin films were formed on peripheral portions. While the deposition regions progress from the peripheral portions to the central portions with increase of deposition times, it is impossible to form homogeneous films in accordance with the conventional and comparative samples since initial homogeneity is reflected on the films.

Figure 10:
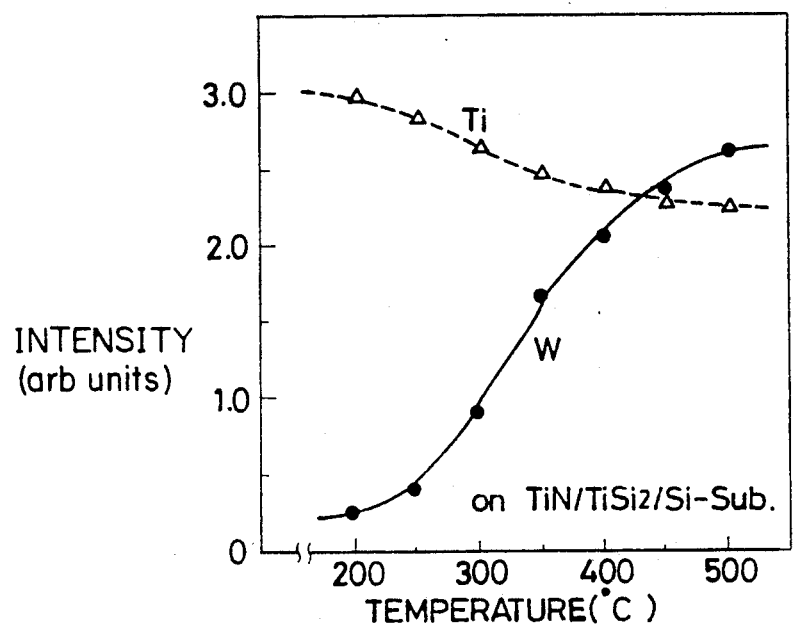
FIG. 10 illustrates treatment temperature dependency states of Ti signal strength and W signal strength on the surfaces of intermediate layers subjected to first step treatment in the embodiment of the present invention.

FIG. 10 illustrates treatment temperature dependency states of Ti signal strength and W signal strength on the surfaces of intermediate layers subjected to the first step treatment in the embodiment according to the present invention, which are measured by x-ray fluorescanse analysis. The first step treatment was carried out at various temperatures shown in FIG. 10, and the surfaces of the as-formed intermediate layers were estimated through fluorescent X-rays, thereby measuring Ti signal strength and W signal strength. Referring to FIG. 10, Ti signal strength and W signal strength substantially remained unchanged at temperatures of not more than 300° C., i.e., in selective CVD-W formation temperature regions. However, at temperatures in excess of 400° C., i.e., in blanket CVD-W formation temperature regions which are noted in the present invention, the W signal strength was abruptly increased. It means that TiN and $WF_6$ reacted with each other in the first step treatment.

Figure 11:
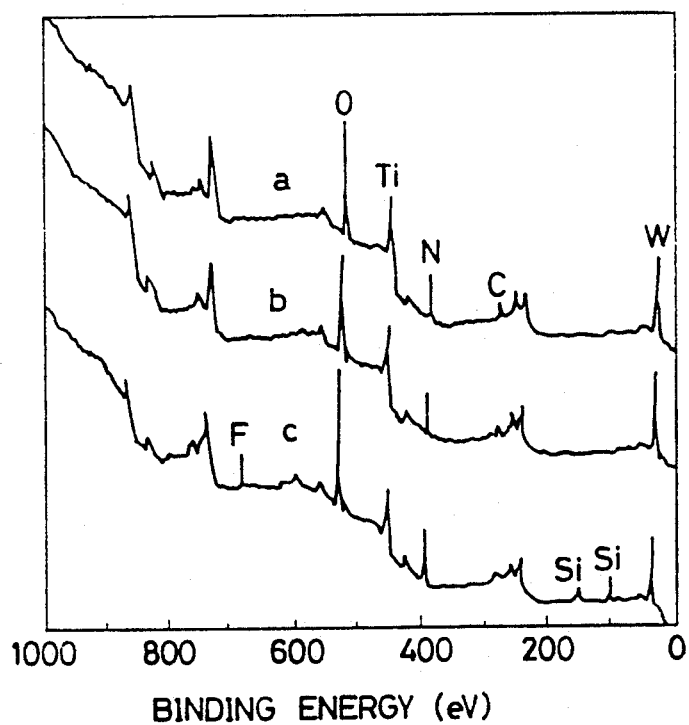
FIG. 11 illustrates results of analysis made on surfaces of intermediate layers subjected to first step treatment and second step treatment through ESCA in the embodiment of the present invention.

FIG. 11 illustrates the results of analysis through ESCA (electron spectroscopy for chemical analysis) made on the surface of intermediate layers which were subjected to the first step treatment and the second step treatment in the embodiment according to the present invention. Referring to FIG. 11, symbol a represents the spectrum on the surface of a TiN layer which was subjected to the first step treatment, and symbol b represents the spectrum on the surface of a TiN layer which was subjected to the first step treatment and thereafter supplied with $H_2$ gas for 120 seconds. Symbol c represents the spectrum on the surface of a TiN layer which was subjected to the first step treatment and thereafter subjected to the second step treatment with introduction of $SiH_4$ gas for 120 seconds according to the present invention. As shown in FIG. 11, Si peaks were observed on the surface of the TiN layer which was subjected to the first step treatment and the second step treatment according to the present invention. On the other hand, no such Si peaks were observed in the comparative samples a and b. It is obvious from FIG. 10 and the spectrum a in FIG. 11 that tungsten is introduced onto the surface of a TiN layer by the first step treatment. As shown in FIG. 8, however, the effect of the present invention cannot be attained through the first step treatment alone. Thus, the first step treatment of introducing tungsten onto the TiN layer is still insufficient, and it is necessary to introduce silicon onto the surface of the TiN layer by carrying out the second step treatment after the first step treatment. It is conceivable that Si-system nuclei thus introduced through the second step treatment facilitate nucleation in the initial process of formation of the tungsten thin film. According to the present invention, it is possible to deposit a tungsten thin film with no induction period. This may be because the Si-system material effectively facilitates nucleation for forming the tungsten thin film.

According to this embodiment, as hereinabove described, $WF_6$ gas is first introduced to activate the surface of the TiN film and then $SiH_4$ gas is introduced to form Si-system nuclei on the activated surface of the TiN film, in advance of deposition of the tungsten thin film. Due to such formation of the Si nuclei, no induction period is required in deposition of the tungsten film, homogeneity of the film thickness is improved, and surface morphology of the tungsten thin film is improved.

According to the present invention, it is possible to form a tungsten thin film of high quality on an intermediate layer such as a TiN layer being difficult for W-CVD. The inventors have found that reaction between $WF_6$ and tungsten can contribute to nucleation in the first step treatment according to the present invention, in addition to reaction between $WF_6$ and TiN. "A Mechanism for Selectivity Loss during Tungsten CVD" by J. R. Creighton, J. Electrochem. Soc., Vol. 136, No. 1, January 1989, p. 271 describes a cause for selectivity loss of selective tungsten-CVD system on an insulating film by Si reduction of a $WF_6$ substrate or the like. This literature states that $WF_x$ is generated by disproportionate reaction between tungsten formed in a contact hole and $WF_6$, such that the generated $WF_x$ is adsorbed onto the insulating film to form nuclei, thereby reducing selectivity of tungsten. The inventors have found that such disproportionate reaction between tungsten and $WF_6$ can also contribute to formation of nuclei on an intermediate layer in blanket W-CVD system, to which the present invention is directed. According to one preferred aspect of the present invention, a halide gas is introduced in a state of arranging a metal face the same metal as that of a thin film close to the surface of an intermediate layer. The metal face is thus arranged close to the surface of the intermediate layer so as to utilize disproportionate reaction caused between the metal face and the halide gas for nuclear formation on the substrate. A gas generated by such disproportionate reaction is adsorbed onto the surface of the intermediate layer, to form precursors for nuclei. In the method of the embodiment using the apparatus shown in FIG. 4, the tungsten film 13 formed on the surface of the substrate support 11 may take part in such disproportionate reaction. Namely, it is conceivable that the tungsten film 13 formed on the surface of the substrate support 11 disproportionately reacts with $WF_6$ to generate $WF_x$, which is adsorbed onto the surface of the TiN layer provided on the substrate 14 and forms nuclei or precursors for nuclei. In the case of the apparatus shown in FIG. 4, therefore, the $WF_x$ gas generated by such disproportionate reaction is introduced from the periphery of the substrate 14. Consequently, the $WF_x$ gas is adsorbed by the peripheral portion of the substrate 14, to form nuclei. Referring to FIGS. 6 to 9, it is conceivable that the thicknesses of the tungsten thin films are increased around the substrates in the case of using the apparatus shown in FIG. 4 because of adsorption of $WF_x$ generated by such disproportionate reaction. The inventors have found that a metal face member may be oppositely arranged above the surface of the intermediate layer, so that $WF_x$ is homogeneously adsorbed onto the surface of the intermediate layer. Thus, the degrees of freedom of $WF_x$ in the direction of providing to the surface of intermediate layer are increased to improve controllability.

An apparatus according to a second aspect of the present invention comprises a pretreatment chamber for performing pretreatment on the surface of an intermediate layer and a deposition layer, which is independent of the pretreatment chamber, for depositing a metal thin film, and the inner surface of the deposition chamber is formed of a material which shows no surface catalytic action with respect to reaction for depositing the metal thin film.

Figure 12:
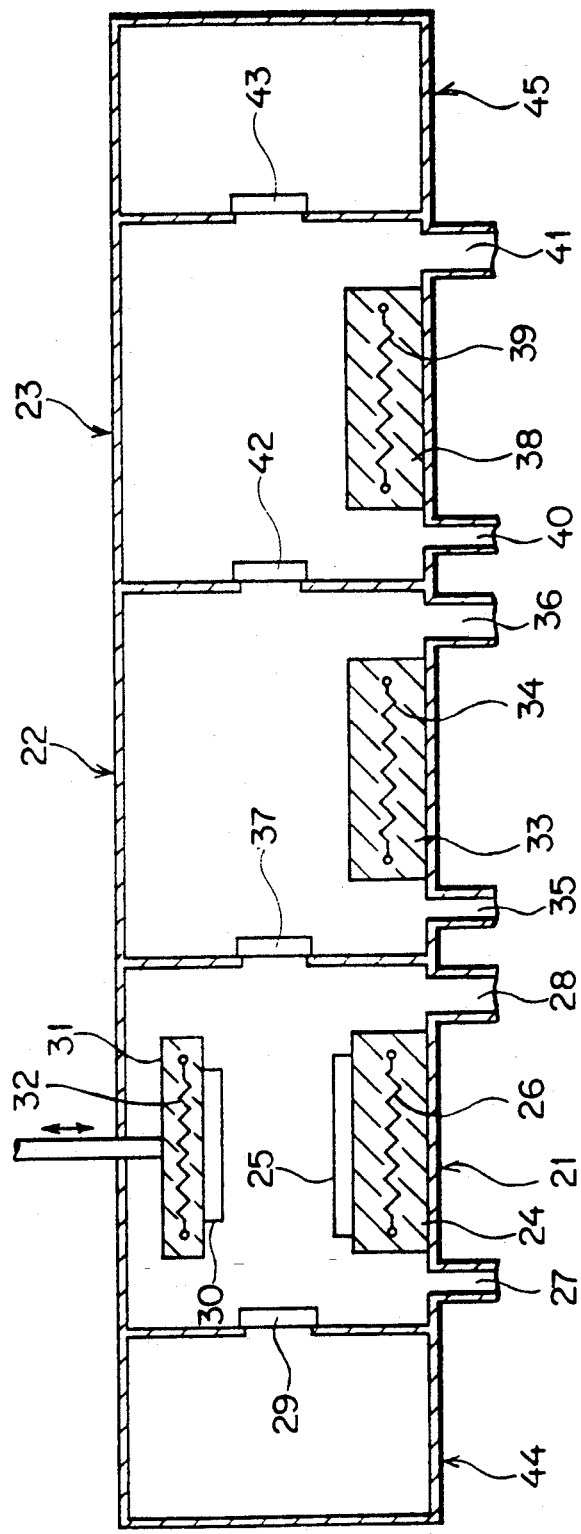
FIG. 12 is a schematic block diagram showing an apparatus in another embodiment according to a second aspect of the present invention.

FIG. 12 is a schematic block diagram showing an apparatus in an embodiment according to the second aspect of the present invention. Referring to FIG. 12, a reaction vessel is divided into three parts of a $WF_6$ pretreatment chamber 21, an $SiH_4$ pretreatment chamber 22 and a tungsten film deposition chamber 23. A substrate stand 24 is provided in the $WF_6$ pretreatment chamber 21, and a substrate 25 is placed on the substrate stand 24. A tungsten plate member, serving as a metal face member 30, is provided above the substrate 25, and supported by a face member support 31. The face member support 31 is provided to be movable in the vertical direction to increase controllability, and a heater 32 is provided in the face member support 31. The $WF_6$ pretreatment chamber 21 is provided with an inlet port 27 for introducing a mixed gas of $WF_6$ gas and a carrier gas, and an exhaust port 28 for exhausting the mixed gas from the $WF_6$ pretreatment chamber 21 to the exterior.

The $SiH_4$ pretreatment chamber 22 is provided adjacently to the $WF_6$ pretreatment chamber 21. A substrate stand 33 is provided in this $SiH_4$ pretreatment chamber 22, and a heater 34 is provided in the substrate stand 33 for heating a substrate which is placed on the substrate stand 33. The $SiH_4$ pretreatment chamber 22 is further provided with an inlet port 35 for introducing a mixed gas of $SiH_4$ gas and a carrier gas, and an exhaust port 36. A transfer door 37 is provided between the $WF_6$ pretreatment chamber 21 and the $SiH_4$ pretreatment chamber 22.

The tungsten film deposition chamber 23 is provided adjacently to the $SiH_4$ pretreatment chamber 22. A substrate stand 38 is provided in the tungsten film deposition chamber 23, and a heater 39 is provided in the substrate stand 38 for heating a substrate which is placed thereon. The tungsten film deposition chamber 23 is further provided with an inlet port 40 for introducing $WF_6$ gas and $H_2$ gas, and an exhaust port 41 for exhausting the gases to the exterior. Another transfer door 42 is provided between the $SiH_4$ pretreatment chamber 22 and the tungsten film deposition chamber 23. The inner surface of the tungsten film deposition chamber 23 is formed of a material which shows no surface catalytic action with respect to reaction for depositing a tungsten film. Such a material can be prepared from quartz, SiC or ceramics, for example.

The $WF_6$ pretreatment chamber 21 is provided with a load locking mechanism 44, and a loading door 29 is provided between the load locking mechanism 44 and the $WF_6$ pretreatment chamber 21. The tungsten film deposition chamber 23 is provided with another load locking mechanism 45, and an unloading door 43 is provided between the load locking mechanism 45 and the tungsten film deposition chamber 23.

Although no mechanism for transferring the substrate 25 is shown in FIG. 12, a generally used transfer mechanism can be employed for transferring the substrate 25.

The substrate 25, which is prepared by forming a TiN layer on a silicon substrate similarly to the aforementioned embodiment, is first introduced into the load locking mechanism 44 under prescribed conditions, and thereafter passed through the loading door 29 and placed on the substrate stand 24 which is provided in the WF$_6$ pretreatment chamber 21. The WF$_6$ gas is introduced into the WF$_6$ pretreatment chamber 21 with the carrier gas through the inlet port 27. The introduced WF$_6$ gas reacts with the TiN layer which is provided on the substrate 25, and forms the aforementioned reaction product on its surface. At the same time, the WF$_6$ gas disproportionately reacts with tungsten contained in the metal face member 30 which is provided above the substrate 25, and generates WF$_x$. The generated WF$_x$ is adsorbed onto the surface of the TiN layer which is provided on the substrate 25. Thus, the material forming precursors for nuclei is adsorbed onto the surface of the TiN layer. At this time, the temperature of the substrate 25 can be adjusted by the heater 26. Further, the temperature of the metal face member 30 can be independently controlled by the heater 32, which is provided in the face member support 31 supporting the metal face member 30, thereby controlling the disproportionate reaction. After such first step treatment, the gases are exhausted from the exhaust port 28, and the substrate 25 thus subjected to the first step treatment is passed through the transfer door 37 and introduced into the SiH$_4$ pretreatment chamber 22, so that the same is in contact with no air.

In the SiH$_4$ pretreatment chamber 22, SiH$_4$ gas is introduced form the inlet port 35 with a carrier gas. The precursors for nuclei formed on the TiN surface of the substrate 25 are formed by the SiH$_4$ gas, to be Si-system nuclei. After such second step treatment, the gases are exhausted to the exterior from the exhaust port 36. The substrate 25 thus provided with the nuclei is passed through the transfer door 42 and introduced into the tungsten film deposition chamber 23, so that the same is in contact with no air in order to maintain the catalytic activity.

In the tungsten film deposition chamber 23, WF$_6$ gas and H$_2$ gas are introduced from the inlet port 40. Thus, the WF$_6$ gas is reduced with the H$_2$ gas, to deposit a tungsten film on the surface of the TiN intermediate layer provided on the substrate 25. Since the Si-system nuclei are already formed on the surface of the TiN layer, the reduction of WF$_6$ with H$_2$ is easily performed and a dense tungsten film can be deposited in a short time. The inner surface of the tungsten film deposition chamber 23 is formed of a material such as quartz, SiC, ceramics or the like, which shows no surface catalytic action against the reaction for forming the tungsten film. Therefore, no tungsten film that may cause dusting is deposited on the inner surface of the tungsten film deposition chamber 23. Thus, the interior of the tungsten film deposition chamber 23 can be regularly maintained clean.

The substrate 25 thus provided with the tungsten film is passed through the unloading door 43, and introduced into the load locking mechanism 45.

In the apparatus according to this embodiment, the metal face member 30 for disproportionate reaction is provided above the substrate 25 in the WF$_6$ pretreatment chamber 21. Since the metal face member 30 is opposite to the surface of the TiN layer provided on the substrate 25, WF$_x$ generated by disproportionate reaction between the metal face member 30 and the WF$_6$ gas is uniformly adsorbed onto the surface of the TiN layer being controlled. Thus, WF$_x$ is prevented from partial adsorption on the peripheral portion, dissimilarly to the case of using the apparatus shown in FIG. 4. WF$_x$ is thus uniformly adsorbed on the surface of the TiN layer, whereby nuclear concentration is homogeneously distributed on the substrate surface, and the tungsten film is deposited in a homogeneous thickness within the surface plane. As the result of such high nuclear concentration and homogeneous distribution, surface smoothness of the deposited tungsten film is also improved.

The inner surface of the tungsten film deposition chamber 23 is formed of the material which has no surface catalytic action with respect to the reaction for forming the tungsten film. Thus, no tungsten film is deposited on the inner surface of the tungsten film deposition chamber 23, and it is possible to greatly reduce dusting which is produced by removal of the deposited W on the inner surface. When the apparatus shown in FIG. 4 is employed, a tungsten film is deposited on the inner surface of the reaction vessel 10, especially on the tungsten film on the substrate support 11. The thickness of this tungsten film is increased every time a tungsten film is formed on an intermediate layer which is provided on a substrate. Therefore, the tungsten film is separated from the wall surface as tungsten film formation is repeated, to cause dusting. In the apparatus shown in FIG. 11, the tungsten film on the inner surface of chamber, which plays an important role as mentioned above, is also a source of dusting. Thus, it is necessary to frequently clean the reaction vessel 10, and hence the operation rate is reduced. However, the apparatus shown in FIG. 12 prevents such dusting, and there is no need to clean the vessel, while the operation rate can be increased.

Although the apparatus shown in FIG. 12 is of a sheet type for treating substrates one by one, the present invention may also be applied to a batch type apparatus.

An inert gas such as Ar gas, He gas or N$_2$ gas can be employed as a carrier gas for WF$_6$ gas or SiH$_4$ gas. In the apparatus shown in FIG. 12, the heater 32 for controlling the temperature of the metal face member 30 is provided in the face member support 31. Thus, it is possible to independently control the temperature of the metal face member 30. In the apparatus shown in FIG. 4, on the other hand, the tungsten film 13 is provided on the surface of the substrate support 11, and there is such possibility that a temperature of substrate 14 is simultaneously changed by controlling the temperature of the tungsten film 13.

According to the second aspect of the present invention, the metal face member for disproportionate reaction is independently provided, whereby the configuration, the size, the distance from the substrate, the position of installation etc. of the metal face member can be adjusted in various ways, thereby controlling distribution of WF$_x$ adsorption on the substrate surface.

Although the apparatus shown in FIG. 12 is divided into three chambers, the same may alternatively be divided into two chambers. For example, the WF$_6$ pretreatment chamber and the SiH$_4$ pretreatment chamber may be integrated into one pretreatment chamber. In this case, gases are entirely exhausted from the chamber upon completion of the first step treatment, to thereafter carry out the second step treatment. At this time, no silicon film is deposited on the metal face member for disproportionate reaction because pyrolysis of SiH$_4$ does not occur under an ordinary pretreatment temperature.

Alternatively, the $SiH_4$ pretreatment chamber and the tungsten film deposition chamber may be integrated into one chamber. In this case, the first step treatment is completed in the $WF_6$ pretreatment chamber, and then the substrate is transferred into the tungsten film deposition chamber and subjected to the second step treatment. At this time, no silicon film is deposited in the tungsten film deposition chamber under an ordinary temperature of blanket W-CVD. After gases are entirely exhausted from the chamber, $WF_6$ gas and $H_2$ gas are introduced with a carrier gas, thereby depositing a tungsten film.

Although the above description has been made only with reference to a method of reducing $WF_6$ with $H_2$ gas, the method and the apparatus according to the present invention are also applicable to a blanket W-CVD process of reducing $WF_6$ with $SiH_4$ gas.

Figure 13:
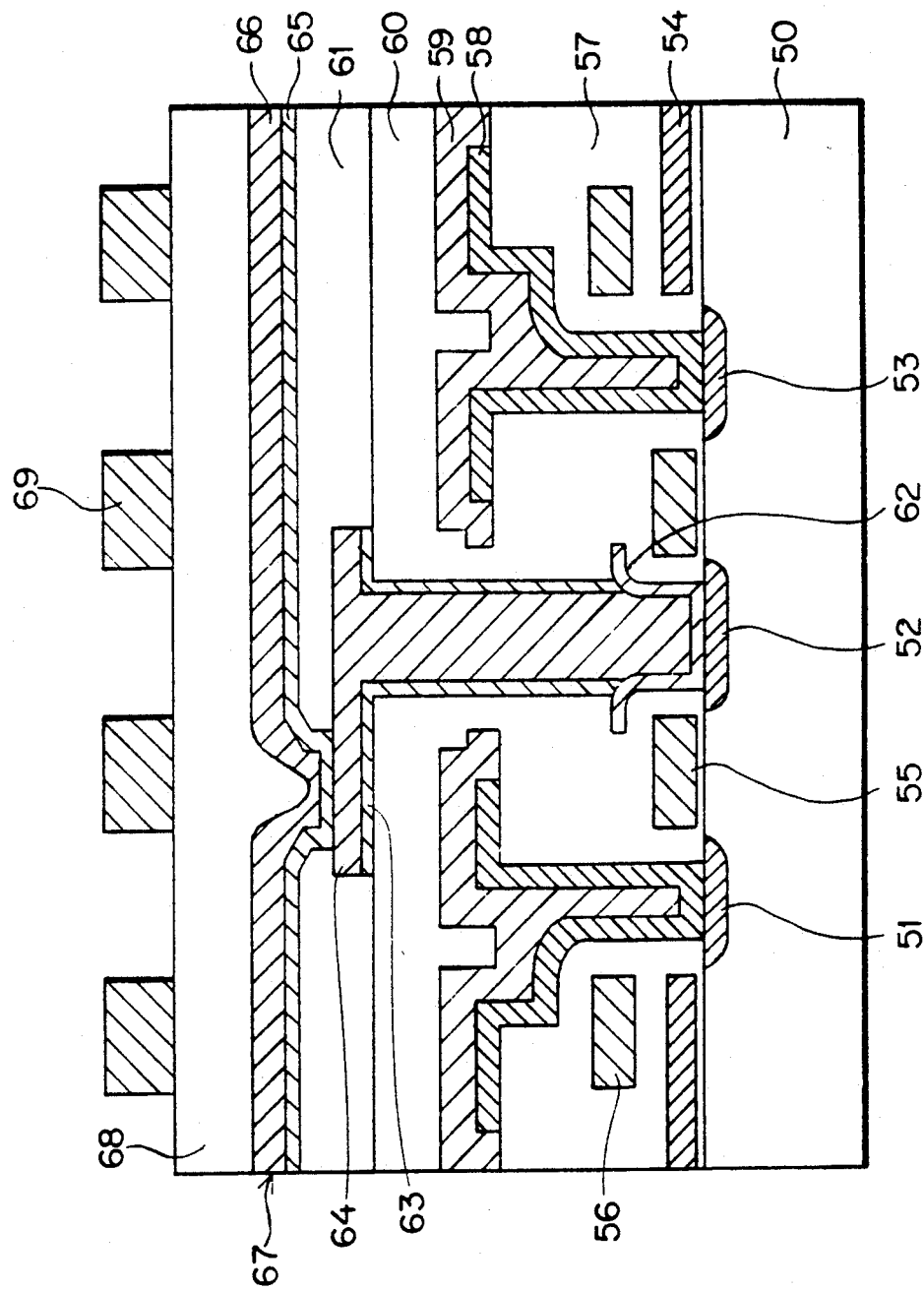
FIG. 13 is a sectional view showing an exemplary semiconductor device to which a metal thin film formed according to the present invention is applied.

FIG. 13 is a sectional view showing an exemplary semiconductor device to which a metal thin film formed according to the present invention is applied. Referring to FIG. 13, numeral 50 indicates a silicon substrate, numerals 51, 52 and 53 indicate impurity diffusion layers, numerals 55 and 56 indicate word lines, numeral 54 indicates a field shield plate, numeral 58 indicates a polysilicon storage node, numeral 59 indicates a polysilicon cell plate, numerals 60 and 61 indicate interlayer isolation films, numeral 62 indicates a plug, numeral 63 indicates a TiN layer, numeral 64 indicates a tungsten plug obtained by etching back CVD-IV, numeral 65 indicates another TiN layer, numeral 66 indicates a tungsten film, numeral 67 indicates a tungsten bit line, numeral 68 indicates an interlayer isolation film, and numeral 69 indicates aluminum wires.

In such a memory cell for a DRAM, tungsten films formed according to the inventive method can be applied to the tungsten plug 64 which is formed on the TiN layer 63, the tungsten film 66 which is formed on the TiN layer 65, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for carrying out tungsten thermal chemical vapor deposition for depositing a tungsten thin film for a semiconductor device comprising:
   a first chamber for introducing a halide gas of tungsten onto a surface of an intermediate layer on a substrate to activate said surface of said intermediate layer; and
   a second chamber for i) receiving said intermediate layer with said activated surface, ii) introducing and exhausting a silane-system gas to form nuclei on said activated said surface, and iii) introducing and exhausting said halide gas of tungsten and a reducing gas to deposit said tungsten thin film on said surface of said intermediate layer by said CVD, wherein
   said first and second chambers are independent and said first chamber includes
   a tungsten face member arranged above and opposite said surface of said intermediate layer, said metal face member providing a source for said nuclei formed on said intermediate layer during introducing and exhausting said silane-system gas in said second chamber; and
   a face member support for supporting said tungsten face member above and opposite said surface of said intermediate layer.

2. An apparatus in accordance with claim 1, wherein said face member support is provided with a heater for controlling the temperature of said tungsten face member.

3. An apparatus in accordance with claim 1, wherein said face member support is movably provided for adjusting the distance between the same and said surface of said intermediate layer.

4. An apparatus in accordance with claim 1, wherein said tungsten face member is a metal member coated with a tungsten film.

5. An apparatus in accordance with claim 1, wherein said tungsten face member is a bulk tungsten plate.

6. An apparatus for carrying out tungsten thermal chemical vapor deposition for depositing a tungsten thin film for a semiconductor device, comprising:
   a pretreatment chamber for performing pretreatment on a surface of an intermediate layer provided on a substrate to control distribution of tungsten film thickness during said thermal CVD; and
   a deposition chamber, provided independently of said pretreatment chamber, for depositing said tungsten thin film on said pretreated surface of said intermediate layer, wherein
   the inner surface of said deposition chamber is formed of a material which is inert during depositing said tungsten thin film.

7. An apparatus in accordance with claim 6, wherein said pretreatment comprises activation treatment with $WF_6$ gas and nucleation treatment with $SiH_4$ gas.

8. An apparatus in accordance with claim 7 wherein said pretreatment chamber includes a first pretreatment chamber for said activation treatment and a second, independent, pretreatment chamber for said nucleation treatment respectively.

9. An apparatus in accordance with claim 7, wherein said material which is inert during deposition of said tungsten thin film is at least one material selected from the group of quartz, SiC and ceramics.

10. An apparatus for carrying out tungsten thermal chemical vapor deposition for depositing a tungsten thin film for a semiconductor device, comprising:
   a pretreatment chamber for activating a surface of an intermediate layer on a substrate and for forming nuclei on said surface of said intermediate layer, said pretreatment chamber containing a substrate support for said substrate; and
   a deposition chamber, provided independently of said pretreatment chamber, for depositing said tungsten thin film on said surface of said intermediate layer; wherein
   said pretreatment chamber includes
   inlet port means for successively introducing to and exhausting from the chamber i) a halide gas of tungsten for activating said surface of said intermediate layer, and ii) a silane-system gas for forming said nuclei on said surface of said intermediate layer;
   a face member having at least a surface formed of said tungsten; and
   a face member support for vertically positioning said tungsten face member near and spaced from the surface of said intermediate layer in said chamber to provide for controlled distribution of tungsten film thickness during said thermal CVD.

11. The apparatus of claim 10, wherein the inner surfaces of the chamber are formed of any of the materials of the group consisting of quartz, silicon and ceramics.

12. The apparatus of claim 10, further comprising
a heater provided in said face member support for controlling the temperature of said face member.

13. The apparatus of claim 10, wherein
said face member is a metal member coated with a tungsten film.

14. The apparatus of claim 10, wherein
said face member is a bulk metal plate.

15. An apparatus for carrying out tungsten thermal chemical vapor deposition for depositing a tungsten thin film on a semiconductor substrate having an intermediate layer, comprising:
a first load locking means for receiving said substrate with said intermediate layer,
a first pretreatment chamber in horizontal communication with said load locking means for introducing and exhausting a halide gas of tungsten to activate a surface of said intermediate layer and,
a second pretreatment chamber in horizontal communication with said first pretreatment chamber for introducing and exhausting a silane-system gas to form nuclei on said activated surface of said intermediate layer;
a deposition chamber in horizontal communication with said second pretreatment chamber for introducing and exhausting said halide gas and a reducing gas to deposit said tungsten thin film on said surface of said intermediate layer by CVD,
a second load locking means in horizontal communication with said deposition chamber for receiving said substrate from said deposition chamber,
a first loading door for connecting the interior of said first load locking means and the interior of said first pretreatment chamber,
a second loading door connecting the interior of said first pretreatment chamber and the interior of said second pretreatment chamber,
a third loading door connecting the interior of said second pretreatment chamber and the interior of said deposition chamber, and
a fourth loading door connection the interior of said deposition chamber with the interior or said second load locking means,
each chamber containing a substrate support for a substrate onto which the tungsten thin film is to be formed and inlet port means for introducing and exhausting the respective gases from each chamber, wherein
said first pretreatment chamber includes
a tungsten face member in said chamber for reacting with at least the halide gas to activate the surface of said intermediate layer; and
a vertically movable face member support in communication with the tungsten face member for supporting and positioning said tungsten face member in proximity to the surface of said intermediate layer in said chamber.

16. An apparatus for carrying out tungsten thermal chemical vapor deposition for depositing a tungsten thin film for a semiconductor device, comprising:
a pretreatment chamber for activating a surface of an intermediate layer on a substrate and for forming nuclei on said surface of said intermediate layer, said pretreatment chamber containing a substrate support for said substrate; and
a deposition chamber, provided independently of said pretreatment chamber, for depositing said tungsten thin film on said surface of said intermediate layer; wherein
said pretreatment chamber includes
inlet port means for successively introducing to and exhausting from the chamber i) tungsten hexafluoride for activating said surface of said intermediate layer, and ii) titanium nitride for forming said nuclei on said surface of said intermediate layer;
a face member having at least a surface formed of said tungsten; and
a face member support for vertically positioning said tungsten face member near and spaced from the surface of said intermediate layer in said chamber to provide for controlled distribution of tungsten film thickness during said thermal CVD.

* * * * *

UNITED STATES PATENT AND TRADEMARK OFFICE
CERTIFICATE OF CORRECTION

PATENT NO. : 5,240,505
DATED : August 31, 1993
INVENTOR(S) : Masanobu IWASAKI et al.

It is certified that error appears in the above-indentified patent and that said Letters Patent is hereby corrected as shown below:

On the title page, please delete the title of the invention and insert therefor: and in column 1, lines 1-3:
--METHOD OF AND APPARATUS FOR FORMING THIN FILM FOR SEMICONDUCTOR DEVICE--.

Signed and Sealed this

Third Day of May, 1994

*Attest:*

BRUCE LEHMAN

*Attesting Officer*  *Commissioner of Patents and Trademarks*